United States Patent
Ikuma et al.

(10) Patent No.: US 10,742,906 B2
(45) Date of Patent: Aug. 11, 2020

(54) SOLID-STATE IMAGING DEVICE AND IMAGING DEVICE CAPABLE OF CORRECTING PIXEL SIGNAL

(71) Applicant: Panasonic Intellectual Property Management Co., Ltd., Osaka (JP)

(72) Inventors: Makoto Ikuma, Kyoto (JP); Takahiro Muroshima, Kyoto (JP); Takayasu Kito, Osaka (JP); Hiroyuki Amikawa, Kyoto (JP); Tetsuya Abe, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/059,517

(22) Filed: Aug. 9, 2018

(65) Prior Publication Data

US 2018/0376081 A1 Dec. 27, 2018

Related U.S. Application Data

(63) Continuation of application No. PCT/JP2017/005056, filed on Feb. 13, 2017.

(30) Foreign Application Priority Data

Feb. 15, 2016 (JP) .................................. 2016-026382

(51) Int. Cl.
  *H04N 5/335* (2011.01)
  *H04N 5/345* (2011.01)
  (Continued)

(52) U.S. Cl.
  CPC .......... *H04N 5/345* (2013.01); *H01L 27/146* (2013.01); *H03M 1/0845* (2013.01);
  (Continued)

(58) Field of Classification Search
  CPC .............................. H04N 5/345; H04N 5/3698
  (Continued)

(56) References Cited

U.S. PATENT DOCUMENTS

| 2008/0111905 A1 | 5/2008 | Toyama et al. |
| 2011/0019039 A1* | 1/2011 | Ikuma ................... H04N 5/357 348/246 |

FOREIGN PATENT DOCUMENTS

| JP | 2007-281540 A | 10/2007 |
| JP | 2011-029793 A | 2/2011 |

OTHER PUBLICATIONS

International Search Report issued in Application No. PCT/JP2017/005056 dated May 9, 2017, with English translation.

* cited by examiner

*Primary Examiner* — Usman A Khan
(74) *Attorney, Agent, or Firm* — McDermott Will & Emery LLP (57) ABSTRACT

A solid-state imaging device includes: a pixel array unit in which a plurality of pixels are arranged in rows and columns; a plurality of column signal lines which are provided in one-to-one correspondence with pixel columns; a column processor including a plurality of column AD circuits provided in one-to-one correspondence with the plurality of column signal lines; a power supply variation detector which is connected to a power supply wire through which a power supply voltage is transmitted to each of the pixels, and which detects, in correspondence with pixel rows, power supply variation components attributed to variations in the power supply voltage; and a power supply variation corrector which corrects, for each of the pixel rows, a pixel signal detected by the column processor, using the power supply variation components detected by the power supply variation detector.

12 Claims, 8 Drawing Sheets

(51) Int. Cl.
  *H01L 27/146*  (2006.01)
  *H04N 5/357*  (2011.01)
  *H04N 5/378*  (2011.01)
  *H03M 1/08*  (2006.01)
  *H04N 5/369*  (2011.01)
  *H04N 5/3745*  (2011.01)
  *H03M 1/56*  (2006.01)
  *H03M 1/12*  (2006.01)

(52) U.S. Cl.
  CPC ........... *H04N 5/357* (2013.01); *H04N 5/3698* (2013.01); *H04N 5/378* (2013.01); *H04N 5/3745* (2013.01); *H03M 1/123* (2013.01); *H03M 1/56* (2013.01)

(58) Field of Classification Search
  USPC ........................................................ 348/308
  See application file for complete search history.

SOLID-STATE IMAGING DEVICE AND IMAGING DEVICE CAPABLE OF CORRECTING PIXEL SIGNAL

CROSS REFERENCE TO RELATED APPLICATIONS

This application is a U.S. continuation application of PCT International Patent Application Number PCT/JP2017/005056 filed on Feb. 13, 2017, claiming the benefit of priority of Japanese Patent Application Number 2016-026382 filed on Feb. 15, 2016, the entire contents of which are hereby incorporated by reference.

BACKGROUND

1. Technical Field

The present disclosure relates to a solid-state imaging device and an imaging device.

2. Description of the Related Art

In a conventional complementary metal oxide semiconductor (CMOS) solid-state imaging device including a column-parallel analog-to-digital (AD) converter, when comparators in the AD converter provided for respective columns are inverted all at once, the voltage drop in the power supply line increases, causing a noise problem.

In response to this problem, for example, Japanese Unexamined Patent Application Publication No. 2007-281540 discloses a configuration in which a capacitor element is connected between a signal line in a comparator and a power supply line. With this configuration, circuit noise due to potential variations in the power supply line can be reduced by the effects of the capacitor element.

SUMMARY

However, the capacitor element disclosed in Japanese Unexamined Patent Application Publication No. 2007-281540 does not effectively function against disturbance noise such as power supply noise. Specifically, in the CMOS solid-state imaging device, if noise is included in a power supply voltage itself which is supplied from an external device to a pixel, a signal read out from the pixel may contain noise in a traverse line form.

Furthermore, for example, when a high-level pixel signal is output from a pixel or when the voltage in the AD converter varies along with an operation of the AD converter, noise may be generated in a vertical signal line. As a result, there is the problem of image quality deterioration (for example, image quality deterioration due to noise in a traverse line form).

The present disclosure provides a solid-state imaging device and an imaging device which reduce image quality deterioration that occurs due to noise superimposed on a power supply voltage supplied to a pixel.

In order to solve the aforementioned problems, a solid-state imaging device according to one aspect of the present disclosure includes: pixels each of which generates a pixel signal; a first detector which detects the pixel signal; a second detector which detects power supply variation components in correspondence with pixel rows in each of which more than one of the pixels are arranged in a row; and a corrector which corrects, for each of the pixel rows, the pixel signal detected by the first detector, using the power supply variation components. The corrector includes: an averaging circuit which calculates a power supply variation average signal by averaging the power supply variation components; an attenuating circuit which attenuates the power supply variation average signal using a predetermined attenuation value corresponding to the pixel signal; and a subtracting circuit which corrects the pixel signal by subtracting, from the pixel signal, the power supply variation average signal attenuated using the predetermined attenuation value.

Furthermore, a solid-state imaging device according to one aspect of the present disclosure includes: a pixel unit in which a plurality of pixels that generate pixel signals corresponding to incident light are arranged in rows and columns; a plurality of first column signal lines which are provided in one-to-one correspondence with pixel columns of the pixel unit and through each of which the pixel signals are transmitted from pixels belonging to one of the pixel columns; a first detector including a plurality of column signal sensors which are provided in one-to-one correspondence with the plurality of first column signal lines and each of which detects the pixel signals transmitted through one of the plurality of first column signal lines; a second detector connected to a pixel power supply wire through which a power supply voltage is transmitted to each of the plurality of pixels, the second detector detecting, in correspondence with pixel rows, power supply variation components attributed to variations in the power supply voltage; and a corrector which corrects, for each of the pixel rows, the pixel signals detected by the first detector, using the power supply variation components detected by the second detector.

With the solid-state imaging device and the imaging device according to the present disclosure, it is possible to reduce image quality deterioration that occurs due to noise superimposed on a power supply voltage supplied to a pixel.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

A solid-state imaging device according to the present embodiment includes: a second detector which detects, for each row, a noise component attributed to variations in a power supply voltage; and a corrector which corrects a pixel signal for each row using the noise component detected by the second detector. With this, the solid-state imaging device according to the present embodiment enables a reduction in image quality deterioration due to external noise superimposed on a power supply voltage supplied to a pixel.

Hereinafter, a solid-state imaging device and an imaging device according to the present disclosure will be described with reference to the drawings. Note that each of the following embodiments shows one specific example of the present disclosure; the numerical values, shapes, materials, structural elements, the arrangement and connection of the structural elements, steps, the processing order of the steps, etc., are mere examples, and are not intended to limit the present disclosure.

There are instances where overly detailed description is omitted. For example, detailed description of well-known matter, redundant description of substantially identical structural elements, etc., may be omitted. This is to prevent the subsequent description from becoming unnecessarily redundant, and thus facilitate understanding by a person having ordinary skill in the art.

1. Configuration of Solid-State Imaging Device

Figure 1:
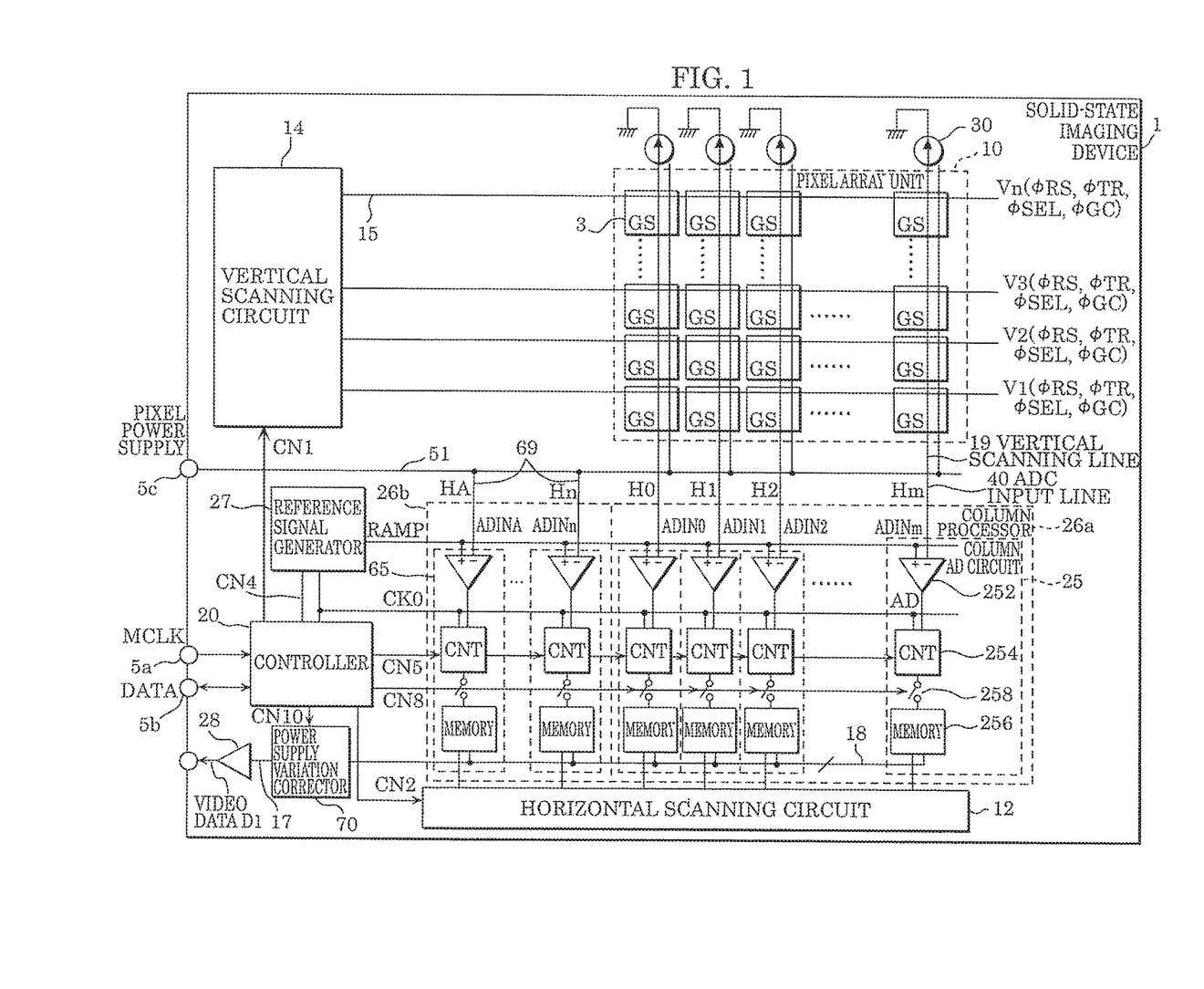
FIG. 1 is a block diagram illustrating a configuration example of a solid-state imaging device according to an embodiment.

FIG. 1 is a block diagram illustrating a configuration example of solid-state imaging device 1 according to an embodiment. As illustrated in this figure, solid-state imaging device 1 includes pixel array unit 10, horizontal scanning circuit 12, vertical scanning circuit 14, vertical signal line 19, controller 20, column processor 26a, power supply variation detector 26b, reference signal generator 27, outputter 28, load current source 30, and power supply variation corrector 70. Furthermore, solid-state imaging device 1 includes: an MCLK terminal to which a master clock signal from an external device is input; a DATA terminal through which a command or data is transmitted and received to and from an external device; a video data terminal, etc., through which video data is transmitted to an external device; and other terminals through which a power supply voltage and a ground voltage are supplied.

Pixel array unit 10 is a pixel unit including a plurality of pixels 3 (also referred to as unit cells) arranged in rows and columns. The plurality of pixels 3 generate pixel signals corresponding to incident light and are arranged in n rows and in columns (where n and m are natural numbers) in FIG. 1.

Vertical signal line 19 is a first column signal line which is provided for each of the pixel columns in pixel array unit 10 and through which the pixel signal from pixel 3 belonging to a selected pixel row is transmitted to column processor 26a. In pixel array unit 10, in vertical signal lines 19 denoted by H0 to Hm are arranged. Note that a downstream part of vertical signal line 19, that is, a part connected to a negative input terminal of column AD circuit 25 included in column processor 26a, is referred to as ADC input line 40. In other words, m ADC input lines 140 denoted by ADIN0 to ADINm are arranged between pixel array unit 10 and column processor 26a.

Column processor 26a is a first detector which includes a plurality of column AD circuits 25 provided for the respective pixel columns in pixel array unit 10 in correspondence with vertical signal lines 19. Each of column AD circuits 25 is a column signal sensor which detects the pixel signal in pixel 3 that has been transmitted through corresponding vertical signal line 19. More specifically, column AD circuit 25 is a first AD conversion circuit which converts the pixel signal transmitted through vertical signal line 19 into a digital signal and performs correlated double sampling to convert the pixel signal from analog to digital.

Column AD circuit 25 includes voltage comparator 252, counter 254, and memory 256.

Voltage comparator 252 compares the analog pixel signal transmitted through vertical signal line 19 and reference signal RAMP generated by reference signal generator 27 and including a ramp wave, and, for example, when the former is greater than the latter, inverts an output signal indicating the comparison result.

Counter 254 counts time from the start of a change in the ramp wave included in reference signal RAMP until the output signal of voltage comparator 252 is inverted. The time counted until the inversion depends on the value of the abovementioned analog pixel signal, and thus the count value is the value of the digitalized pixel signal.

Memory 256 holds the count value of counter 254, that is, the digital pixel signal.

Reference signal generator 27 generates reference signal RAMP including the ramp wave and outputs reference signal RAMP to a positive input terminal of voltage comparator 252 inside each column AD circuit 25.

Power supply variation detector 26b is a second detector which is connected to power supply wire 51 through which a power supply voltage is transmitted to each of the plurality of pixels 3, and detects, in correspondence with the pixel rows, power supply variation components attributed to variations in the voltage of a pixel power supply. Details of power supply variation detector 26b will be described later.

Horizontal scanning circuit 12 sequentially scans memories 256 in column AD circuits 25 and thus outputs the pixel signals converted from analog to digital to outputter 28 through horizontal signal line 18.

Vertical scanning circuit 14 scans, on a per row basis, horizontal scanning line groups 15 (also referred to as row control line groups) provided for the respective pixel rows in pixel array unit 10. This allows vertical scanning circuit 14 to select pixels 3 on a per row basis and simultaneously output, to in vertical signal lines 19, the pixel signals from pixels 3 belonging to the selected row. The same number of horizontal scanning line groups 15 as the rows of pixels 3 are provided. In FIG. 1, n horizontal scanning line groups 15 (in FIG. 1, V1, V2, . . . , Vn) are provided. Each of horizontal scanning line groups 15 includes reset control line φRS, readout control line φTR, selection control line φSEL, and pixel gain control signal φGC.

Power supply variation corrector 70 is a corrector which corrects, for each of the pixel rows, the pixel signal detected by column processor 26a, using the power supply variation components detected by power supply variation detector 26b. Details of power supply variation corrector 70 will be described later.

Controller 20 generates various control signal groups to control entire solid-state imaging device 1. The various control signal groups include control signal groups CN1, CN2, CN5, CN8, and CN10 and counter clock signal CK0. For example, controller 20 receives master clock MCLK via terminal 5a and generates various internal clocks to control horizontal scanning circuit 12, vertical scanning circuit 14, etc.

Outputter 28 outputs, to a video data terminal, the digital pixel signal read out from memory 256 through horizontal signal line 18 as a result of scanning by horizontal scanning circuit 12.

Load current source 30 is a load circuit which is provided for each vertical signal line 19 and supplies a load current to vertical signal line 19. Specifically, load current source 30 supplies the load current through vertical signal line 19 to an amplification transistor included in selected pixel 3, and forms a source-follower circuit together with the amplification transistor. A pixel power supply voltage is supplied from an external device via terminal 5c and applied to each pixel 3 through power supply wire 51.

2. Circuit Configuration of Pixel 3

Next, the circuit configuration of pixel 3 will be described.

Figure 2:
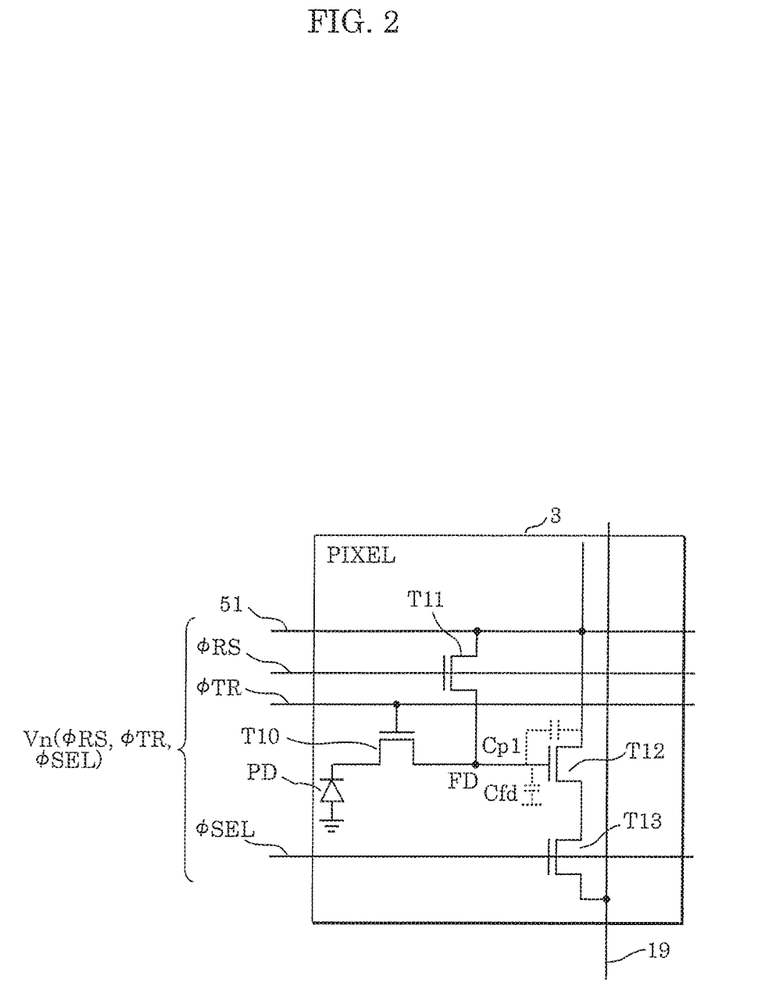
FIG. 2 illustrates one example of the circuit configuration of a pixel according to an embodiment.

FIG. 2 illustrates one example of the circuit configuration of pixel 3 according to the embodiment. Pixels 3 are arranged in n rows and m columns in pixel array unit 10. As illustrated in FIG. 2, pixel 3 includes: photodiode PD which is a light-receiving element; floating diffusion layer FD; readout transistor T10; reset transistor T11; amplification transistor T12; and selection transistor T13.

Photodiode PD is a light receiver which performs photoelectric conversion corresponding to incident light, and generates charges corresponding to the amount of received light (incident light).

Floating diffusion layer FD is a charge accumulator in which the charges read out from photodiode PD via readout transistor T10 are temporarily retained.

Readout transistor T10 reads out (in other words, transfers) the charges from photodiode PD to floating diffusion layer FD according to a readout control signal in readout control line φTR.

Reset transistor T11 resets the charges in floating diffusion layer FD according to a reset control signal in reset control line φRS.

Amplification transistor T12 amplifies a voltage corresponding to the charges retained in floating diffusion layer FD and outputs the amplified signal to vertical signal line 19 via selection transistor T13 as a pixel signal.

Selection transistor T13 selects, according to a selection control signal in selection control line φSEL, whether or not to output the pixel signal in amplification transistor T12 to vertical signal line 19.

Note that although FIG. 2 illustrates an example of pixel 3 having what is called a one-pixel one-cell structure, pixel 3 may have what is called a multi-pixel one-cell structure. Pixel 3 having the multi-pixel one-cell structure may include a plurality of photodiodes PD and share, in a unit cell, one or all of floating diffusion layer FD, reset transistor T11, amplification transistor T12, and selection transistor T13, for example.

3. Configurations of Power Supply Variation Detector 26b and Power Supply Variation Corrector 70

Next, power supply variation detector 26b and power supply variation corrector 70 which are main features of solid-state imaging device 1 according to the present embodiment will be described.

Power supply variation detector 26b is the second detector which detects a per-row power supply variation component attributed to a variation in the power supply voltage. As illustrated in FIG. 1, power supply variation detector 26b includes a plurality of power supply variation sensors 65. An input end of power supply variation sensor 65 is connected to power supply wire 51 through second column signal line 69. Power supply variation sensor 65 is a second AD conversion circuit which converts the power supply variation component in power supply wire 51 into a digital signal and performs correlated double sampling to convert the power supply variation component from analog to digital.

As with column AD circuit 25, power supply variation sensor 65 includes voltage comparator 252, counter 254, and memory 256. The structural elements of power supply variation sensor 65, i.e., voltage comparator 252, counter 254, and memory 256, are substantially the same as those of column AD circuit 25 and therefore description thereof here will be omitted. Specifically, each counter 254 in column AD circuit 25 and each counter 254 in power supply variation sensor 65 convert an analog pixel signal and an analog power supply variation component, respectively, into digital ones, and output the digitalized pixel signal and the digitalized power supply variation component, respectively, to memories 256.

Figure 3:
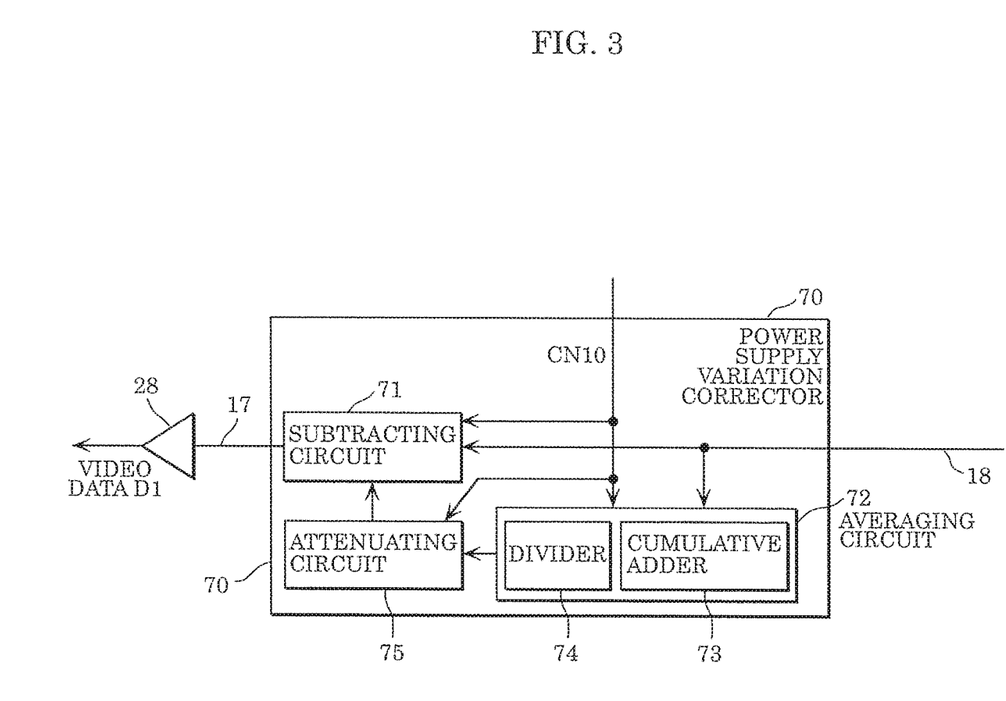
FIG. 3 is a block diagram illustrating a configuration example of a power supply variation corrector and an outputter according to an embodiment.

FIG. 3 is a block diagram illustrating a configuration example of power supply variation corrector 70 and outputter 28 according to an embodiment. As illustrated in this figure, power supply variation corrector 70 includes subtracting circuit 71, averaging circuit 72, and attenuating circuit 75. Averaging circuit 72 includes cumulative adder 73 and divider 74.

Averaging circuit 72 calculates a power supply variation average signal by averaging, for each of the pixel rows, a plurality of digital power supply variation components detected in the pixel row by power supply variation sensor 65. More specifically, cumulative adder 73 accumulates the plurality of digital power supply variation components detected in each of the pixel rows by power supply variation detector 26b, and divider 74 divides the accumulated cumulative addition power supply variation components by the number of power supply variation sensors 65. In this way, averaging circuit 72 calculates the power supply variation average signal.

Attenuating circuit 75 attenuates the power supply variation average signal calculated by averaging circuit 72, using a predetermination attenuation value associated with a pixel gain defined by the charge accumulator and the amplification transistor in pixel 3, so as to allow the power supply variation component superimposed on the pixel signal to be removed with high accuracy in downstream subtracting circuit 71.

Subtracting circuit 71 corrects the pixel signal by subtracting the power supply variation average signal attenuated using the abovementioned predetermined attenuation value from the digital pixel signal detected in each of the pixel rows by column processor 26a.

The pixel signal corrected in this way is output to outputter 28 through output signal line 17 and then output to an external device as video data D1.

Note that power supply variation corrector 70 according to the present embodiment is configured to include attenuating circuit 75 in addition to subtracting circuit 71 and averaging circuit 72, but subtracting circuit 71 may have the attenuating function of attenuating circuit 75. In other words, attenuating circuit 75 does not need to be provided; instead, subtracting circuit 71 may have both the attenuating function and the subtracting function.

The predetermined attenuation value defined in attenuating circuit 75 is used not only as a value for converting the power supply variation average signal output from averaging circuit 72 into a smaller value, but also as a value for converting the power supply variation average signal output from averaging circuit 72 into a larger value, that is, in the case where the amplifying function is provided.

The abovementioned configuration enables an accurate reduction in image quality deterioration that is due to external noise superimposed on the power supply voltage supplied to pixel 3.

Note that pixel 3, vertical signal line 19, column processor 26a, and power supply variation detector 26b may be included in the same LSI chip while power supply variation corrector 70 is externally connected to said LSI chip.

4. Operations of General Solid-State Imaging Device

Next, operations of a general solid-state imaging device will be described with reference to a part of the drawings of solid-state imaging device 1 according to the present embodiment.

Figure 4:
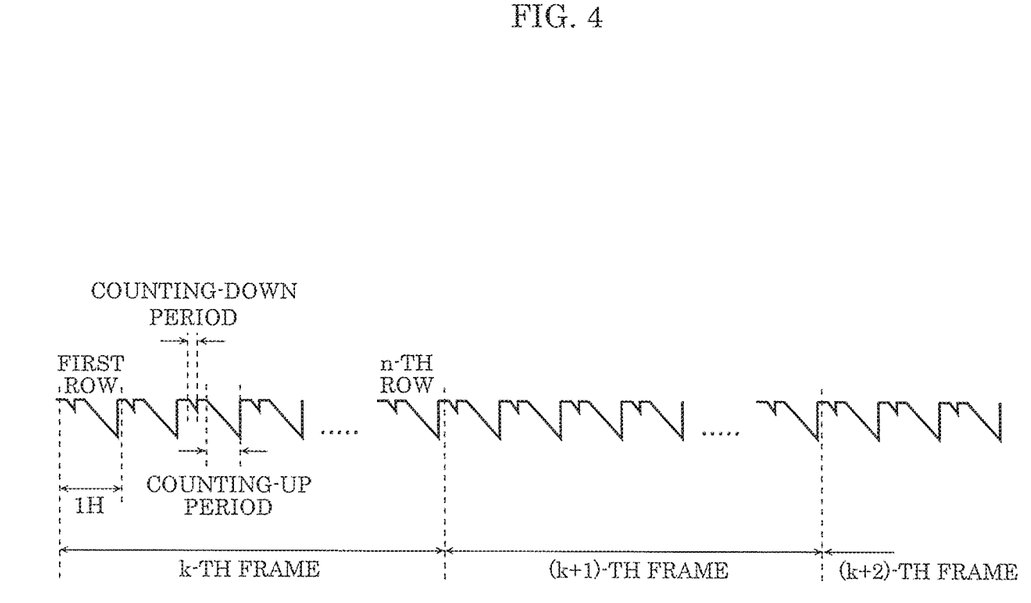
FIG. 4 is a timing chart illustrating an operation example in frame periods of a solid-state imaging device.

FIG. 4 is a timing chart illustrating an operation example in frame periods of the solid-state imaging device. In this figure, the waveform of reference signal RAMP from the k-th frame to the (k+2)-th frame is schematically illustrated. One frame is made up of n horizontal scanning periods (period 1H in this figure) corresponding to the first to n-th rows in pixel array unit 10 made up of pixels 3 in n rows and m columns.

Figure 5:
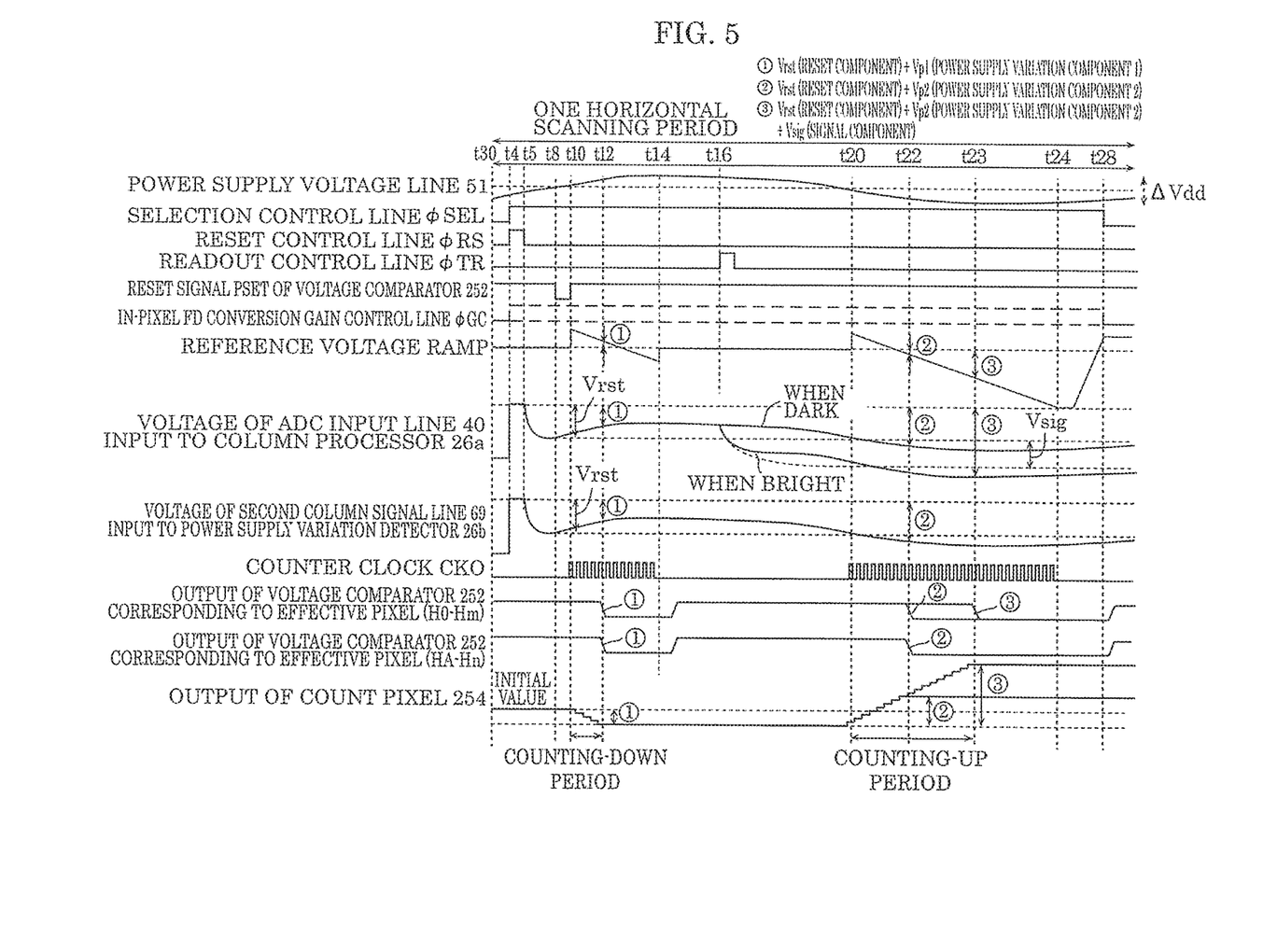
FIG. 5 is a timing chart illustrating an operation example in one horizontal scanning period of a solid-state imaging device according to an embodiment.

FIG. 5 is a timing chart illustrating an operation example in one horizontal scanning period of solid-state imaging device 1 according to the embodiment. Operations in one horizontal scanning period of a general solid-state imaging device will be described with reference to a part of FIG. 5.

In each horizontal scanning period, reference signal RAMP has a ramp waveform in each of counting-down periods and counting-up periods, as illustrated in FIG. 4 and FIG. 5.

The counting-down period is for converting, from analog to digital, a first pixel signal indicating the level of a reset component Vrst which is output from amplification transistor T12 illustrated in FIG. 3. Counter 254 counts down the time from the start of the counting-down period (the start of a change in the ramp wave) until the output of voltage comparator 252 is inverted. This count value is the result itself of AD conversion of analog reset component Vrst.

The counting-up period is for converting, from analog to digital, a second pixel signal indicating the level of a data component (signal component Vsig+reset component Vrst) which is output from amplification transistor T12. Counter 254 counts up the time from the start of the counting-up period (the start of a change in the ramp wave) until the output of voltage comparator 252 is inverted. This counting-up operation causes analog data components (Vsig+Vrst) into a digital value. In this counting-up operation, a counting-down value indicating reset component Vrst is used as an initial value, and thus the count vale at the end of the counting-up period indicates the result of correlated double sampling (CDS) in which reset component Vrst is subtracted from the data components (Vsig+Vrst). In other words, the count value at the end of the counting-up period is signal component Vsig itself. In this way, column AD circuit 25 extracts only true signal level Vsig by eliminating variations in each column, such as clock skew and counter delays, which become errors; thus, column AD circuit 25 performs digital CDS.

Such an operation in one horizontal scanning period is sequentially performed on the n rows, and thus an image in one frame is obtained.

5. Problems with Conventional Solid-state Imaging Device

FIG. 5 schematically illustrates voltage variations ΔVdd in power supply wire 51. When the power supply voltage varies as in this figure, floating diffusion layer FD operates in conjunction with the variations in the power supply voltage because of parasitic capacitance Cgd between the gate and the drain of amplification transistor T12, for example. In this case, a conventional solid-state imaging device, which does not include power supply variation detector 26b or power supply variation corrector 70, is unable to suppress pixel output variations attributed to said variations in the power supply voltage. Therefore, it is not possible to avoid noise entry common to all the columns; in an environment in which the power supply varies significantly, noise in a traverse line form due to the variations in the power supply voltage is generated, causing significant image quality deterioration. This defect of the conventional solid-state imaging device will be described in detail below.

Voltage comparator 252 goes through a large change in electric current upon comparison and inversion, which results in a potential change in a comparator power supply voltage. In response, the capacitor element disclosed in Japanese Unexamined Patent Application Publication No. 2007-281540 is provided between the power supply voltage of voltage comparator 252 and the output of voltage comparator 252, and thus the voltage between the gate and the source of a downstream source-grounded amplification circuit can be maintained. With this, it is possible to prevent the comparison result of voltage comparator 252 from fluctuating because of the potential change in the power supply voltage of voltage comparator 252. However, in the conventional solid-state imaging device, floating diffusion layer FD has parasitic capacitance Cp1 with respect to a power supply voltage line because of parasitic capacitance Cgd at amplification transistor T12 and the parasitic capacitance between floating diffusion layer FD and the power supply voltage line, for example.

Furthermore, when the power supply voltage has voltage variations ΔVdd due to disturbance noise such as power supply noise, floating diffusion layer FD also fluctuates at a rate determined according to the ratio between parasitic capacitance Cp1 and parasitic capacitance Cfd of floating diffusion layer FD. This means that the fluctuation of floating diffusion layer FD affects the signal transferred from photodiode PD, causing image quality deterioration.

For example, when amplification transistor T12 first outputs reset component Vrst, i.e., the first pixel signal, to vertical signal line 19, and then outputs signal component Vsig, i.e., the second pixel signal, to vertical signal line 19, it is assumed that the cycle of voltage variations ΔVdd is different between the readout period for the first pixel signal and the readout period for the second pixel signal. Thus, voltage variations ΔVdd which change with time propagate to floating diffusion layer FD via parasitic capacitance Cp1, and therefore the accuracy of the CDS is degraded, leading to image quality deterioration.

Here, in the case where the capacitance of floating diffusion layer FD is denoted as Cfd and the gain of amplification transistor T12 is denoted as GSF, power supply variation component ΔVn1 which is output to vertical signal line 19 is represented by Expression 1 below.

[Math. 1]

$$\Delta Vn1 = \frac{Cp1}{(Cfd + Cp1)} \cdot \Delta Vdd \cdot GSF \quad \text{(Expression 1)}$$

In other words, Expression 1 indicates that power supply variation component ΔVn1 is the product of voltage variations ΔVdd and a pixel gain (Gain1=GSF×CP1/(Cfd±Cp1)) defined by floating diffusion layer PD and amplification transistor T12. Power supply variation component ΔVn1 is input to voltage comparator 252 in column processor 26a through vertical signal line 19. At this time, for example, the capacitor element disclosed in Japanese Unexamined Patent Application Publication No. 2007-281540 is effective against variations in the power supply voltage of voltage comparator 252, but noise attributed to variations in the power supply voltage applied to pixel 3 cannot be distinguished from the image signal that is output from pixel 3, and thus it is not possible to remove such noise. Thus, the conventional solid-state imaging device is unable to suppress image quality deterioration due to disturbance noise such as power supply noise.

6. Operations of Solid-State Imaging Device According to Embodiment

Solid-state imaging device 1 according to the present embodiment is different from the above-described conventional solid-state imaging device in that solid-state imaging device 1 includes power supply variation detector 26b and power supply variation corrector 70. Operations of solid-state imaging device 1 according to the present embodiment will be described in detail below.

In solid-state imaging device 1 according to the present embodiment, power supply variation detector 26b illustrated in FIG. 1 detects voltage variations ΔVdd of the power supply. Here, power supply variations ΔVn2, which are detected by power supply variation detector 26b, are detected directly through power supply wire 51, not via amplification transistor T12, and therefore represented by Expression 2 below.

[Math. 2]

$$\Delta Vn2 = \Delta Vdd \quad \text{(Expression 2)}$$

As described above, power supply variation component ΔVn1 detected by column processor 26a and power supply variation component ΔVn2 detected by power supply variation detector 26b are different in the ratio of the pixel gain (Gain1) defined by the capacitance of floating diffusion layer FD and gain GSF of amplification transistor T12. This means that when power supply variation component ΔVn2 detected by power supply variation corrector 70 is multiplied, for attenuation, by the pixel gain (Gain1) in Expression 1, the power supply variation components detected by power supply variation corrector 70 are made equal to the power supply variation components detected in an effective pixel region. In other words, when the product of power supply variation components ΔVn2 and the pixel gain (Gain1) in Expression 1 is subtracted from the pixel signal detected by column processor 26a, the pixel signal can be corrected with high accuracy. This relationship is represented by Expression 3 below.

[Math. 3]

$$\text{Power Supply Variation Components of Corrected Pixel Signal} = \Delta Vn1 - \Delta Vn2\left(\frac{Cp1}{Cfd + Cp1} \cdot GSF\right) = 0 \quad \text{(Expression 3)}$$

Hereinafter, the abovementioned correction operation of solid-state imaging device 1 during the CDS will be described with reference to FIG. 5.

First, for the purpose of the first readout, controller 20 resets the count value of counter 254 to a preset initial value and sets counter 254 to a counting-down mode. Here, the initial count value may be "0" or may be an arbitrary value.

Next, at time t4, vertical scanning circuit 14 sets selection control line φSEL to the high level and turns ON selection transistor T13 in pixel 3. Accordingly, selected pixel row Vx is selected.

Furthermore, at time t4, vertical scanning circuit 14 sets reset control line φRS to the high level and turns ON reset transistor T11 in the state where readout control line φTR is at the low level and readout transistor T10 is OFF. Accordingly, the voltage at floating diffusion layer FD in each pixel 3 is reset to the power supply voltage.

Next, at time t5 when the voltage at floating diffusion layer FD is reset after a lapse of predetermined time, vertical scanning circuit 14 sets reset control line φRS to the low level and turns OFF reset transistor T11.

At this time, the voltage at floating diffusion layer FD in each pixel 3 is amplified by amplification transistor T12, and reset component Vrst is read out through vertical signal line 19. The power supply variation component originating from the power supply voltage has been superimposed on this reset component Vrst. At the time of counting down reset component Vrst, controller 20 supplies control signal CN4 for generating reference signal RAMP to reference signal generator 27. In response, reference signal generator 27 outputs reference signal RAMP having a ramp wave as a comparison voltage for one input terminal. (+) of voltage comparator 252.

At time t10 through time t14, voltage comparator 252 compares the voltage of reference signal RAMP and a voltage indicating the reset component (Vrst) transmitted through ADC input line 40 (ADINx) of each column.

Furthermore, as the first counting operation, counting down from the preset initial value starts at the same time as the start; (time t10) of a change in the ramp wave of reference signal RAMP that is input to the input terminal (+) of voltage comparator 252. Specifically, in order to measure comparison time in voltage comparator 252 by counter 254 disposed for each column, controller 20 supplies count clock CK0 to the clock terminal of counter 254 in synchronization (time t10) with the ramp waveform voltage output from reference signal generator 27.

Furthermore, voltage comparator 252 compares reference signal RAMP input from reference signal generator 27 and a total value (Vrst+Vp1) of the voltage of the pixel reset component and the power supply variation value for the selected Vx row which are input through ADC input line 40, and when the both voltages match, the output of voltage comparator 252 is inverted from the H level to the L level (time t12). This means that the voltage corresponding to the total value of reset component Vrst and power supply variation value Vp1 is compared to reference signal RAMP, and the magnitude in the temporal axis direction that corresponds to the magnitude of reset component Vrst is counted (measured) using count clock CK0; thus, the count value corresponding to the magnitude of the total value of reset component Vrst and power supply variation value Vp1 is obtained. In other words, counter 254 obtains the count value corresponding to the magnitude of the total value of reset component Vrst and power supply variation value Vp1 by counting down the time from a point in time when a change in the ramp wave in reference signal RAMP starts, as a counting-down start point for counter 254, until the output of voltage comparator 252 is inverted.

When a predetermined counting-down period elapses (time t14), controller 20 stops supplying control data to voltage comparator 252 and supplying count clock CK0 to counter 254. Accordingly, voltage comparator 252 stops generating the ramp wave of reference signal RAMP.

During the first readout, the counting operation is performed while voltage comparator 252 detects reset component Vrst in the pixel signal voltage for the selected Vx row; thus, reset component Vrst of pixel 3 is read out.

In this way, column AD circuit 25 reads out the output signal of vertical signal line 19 through the CDS (time t14).

Note that offset values (time t10 when the counting-down period starts and time t20 when the counting-up period starts) may be set at the timing of the start of a change in the ramp wave in reference signal RAMP so that the detection is possible even when the power supply variation component has a negative value.

Next, when the AD conversion of the reset component of the pixel signal ends, then the second pixel signal readout operation starts. Furthermore, during the second readout, an operation of reading out not only reset component Vrst, but also signal component Vsig corresponding to the amount of incident light for each pixel 3 is performed. A difference from the first readout is to set counter 254 to a counting-up mode.

Specifically, at time t16, vertical scanning circuit 14 sets readout control line φTR to the high level and turns ON readout transistor T10. This causes the entire photocharges accumulated in photodiode PD are transmitted to floating diffusion layer FD. Subsequently, vertical scanning circuit 14 sets readout control line φTR to the low level and turns off readout transistor T10. At this time, the total value (Vrst+Vsig)+Vp2 of the data components of amplification transistor T12 and the power supply variation value are read out through vertical signal line 19. In this case, similar to the abovementioned first readout operation, the variation component of the power supply voltage is superimposed on vertical signal line 19. Counter 254 counts up time in this state. During this counting-up operation, reference signal RAMP which is the ramp wave output from reference signal generator 27 is input to one input terminal (+) of voltage comparator 252, and the total value (Vrst+Vsig)+Vp2 of the data components and the power supply variation value is input through ADC input line 40 (ADINx) for each column; then, voltage comparator 252 compares the both voltages. At this time, since the comparison time in voltage comparator 252 is measured using counter 24 at the same time as the input of reference signal RAMP to one input terminal (+) of voltage comparator 252, counter 24 starts counting up, as the second counting operation, from the count value at which the counting-down operation had been stopped, in synchronization with the ramp waveform voltage generated from reference signal generator 27 (time t20).

Furthermore, voltage comparator 252 inverts the comparator output from the H level to the L level when the abovementioned both voltages match (time t23).

In this way, column AD circuit 25 reads out the output signal of vertical signal line 19 through the CDS (time t24).

Specifically, at time t20 through time t24, the voltage signal corresponding to the total value (Vrst+Vsig)+Vp2 of the data components and the power supply variation value is compared to reference signal RAMP, and the magnitude in the temporal axis direction that corresponds to the magnitude of the total value Vsig+(Vp2−Vp1) of the signal component and the power supply variation value is counted. (measured) using count clock CK0. As described, above, using digital CDS, counter 254 is configured to count down when reading out the total value (Vrst+Vp1) of the reset component and the power supply variation value, and count up when reading out the total value (Vrst+Vsig+Vp2) of the data components and the power supply variation value. This allows automatic subtraction in counter 254; thus, it is possible to obtain a count value corresponding to the total value Vsig+(Vp2−Vp1) of the signal component and the power supply variation value.

Here, the output power supply variation component (Vp2−Vp1) corresponds to ΔVn1 indicated in the above Expression 1.

The data converted from analog to digital Vsig (Vp2−Vp1) is held in memory 256. Specifically, before the operation of counter 254 (time t30), the result of counting for the last row Vx−1 is transferred from controller 20 to memory 256 on the basis of memory transfer instruction pulse control signal CN8.

In this way, column AD circuit 25 performs the digital CDS upon the pixel readout for every pixel row Vx.

Meanwhile, in power supply variation detector 26b, since second column signal line 69 is directly connected to power supply wire 51 not via pixel 3, power supply variation component ΔVdd is not amplified (pixel gain Gain1 in Expression 1 is not multiplied). Thus, substantially the same readout operation is performed, and the AD converted data at time t22 when the counting-up operation ends is power supply variation component ΔVdd (Vp2−Vp1)/Gain1).

Column processor 26a detects, through the CDS, the pixel signal transmitted from vertical signal line 19, and power supply variation detector 26b detects the power supply variation component through the CDS at the same timing as the timing of detecting the pixel signal by column processor 26a.

In FIG. 5, the voltage of ADC input line 40 which is input to column processor 26a and the voltage of second column signal line 69 which is input to power supply variation detector 26b where Gain1=1 are shown, in order to facilitate understanding of the above-mentioned operations and because the effect is subtle. This is because, when power supply variation components ΔVdd that are input to column processor 26a and power supply variation detector 26b have different amplitudes due to the scale factor of Gain1, the time error at time t12 when the counting-down operation ends and the time error at time t22 and time t33 when the counting-up operation ends are sufficiently small compared to the cycle of power supply variation. Furthermore, in power supply variation detector 26b, the time at which the counting-up operation ends is time t22. In column processor 26a, this is also time t22 in the dark state (where signal component Vsig=0), but is time t23 when bright (where signal component Vsig≠0). This is because, at time t22 and time t23, power supply, variations are different in phase due to a temporal difference and thus, power supply variation values are not completely equal.

The power supply variations are likely to visually appear in the dark to low illuminance states; in this state, the power supply variation at time t22 when the counting-up operation by column processor 26a (H0 to Hm) ends and the power supply variation at time 22 when the counting-up operation by power supply variation detector 26b (HA to Hn) have approximately the same phase, resulting in successful correction.

In contrast, when it is bright, the power supply variations are less likely to visually appear, and thus the error of the power supply variation value dependent on the temporal difference between time t22 when the counting-up operation by column processor 26a (H0 to Hm) ends and time t23 when the counting-up operation by power supply variation detector 26b (HA to Hn) ends is considered not problematic.

Thus, in solid-state imaging device 1 according to the present embodiment, as illustrated in FIG. 5, one horizontal scanning period for reading pixels 3 in each pixel row Vx includes the counting-down period and the counting-up period during which the conversion from analog to digital is performed.

7. Correction Method for Solid-State Imaging Device

Compared to the conventional solid-state imaging device, solid-state imaging device 1 according to the present embodiment is characterized by including power supply variation detector 26b and power supply variation corrector 70 and thus is capable of reducing, through correction, the power supply variation components superimposed on the pixel signals. Hereinafter, the method for correcting solid-state imaging device 1 according to the present embodiment will be described.

When power supply variation component ΔVdd is weak, there is a risk of failure to appropriately detect power supply variation component ΔVdd because of being embedded in random noise. Therefore, in order to accurately calculate power supply variation component ΔVdd in each horizontal line, random noise in the selected row that is different for each column needs to be averaged through canceling in each horizontal line using averaging circuit 72 illustrated in FIG. 3. Subsequently; if, using attenuating circuit 75 and subtracting circuit 71, the result of calculation by averaging circuit 72 is subtracted from each signal output from pixel 3, noise in a traverse line form, which has a relatively high frequency and is difficult to remove through the digital CDS, would be able to be reduced through correction. This means that it is possible to reduce, theoretically eliminate, the noise in a traverse line form through the noise correction according to the present embodiment. Hereinafter, description will be given with reference to FIG. 6A to FIG. 6C.

Figure 6A:
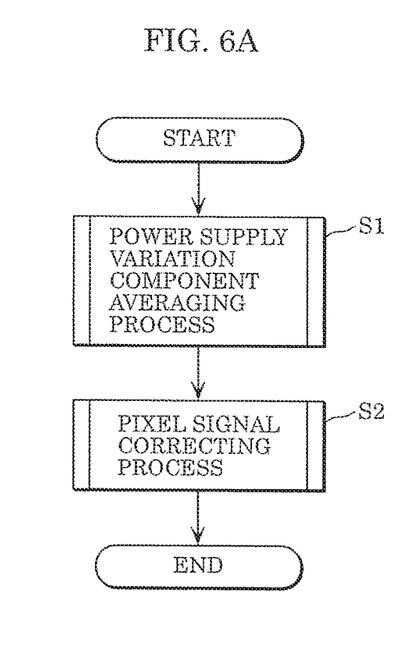
FIG. 6A is an operation flowchart illustrating a correction method for a solid-state imaging device according to an embodiment.
Figure 6B:
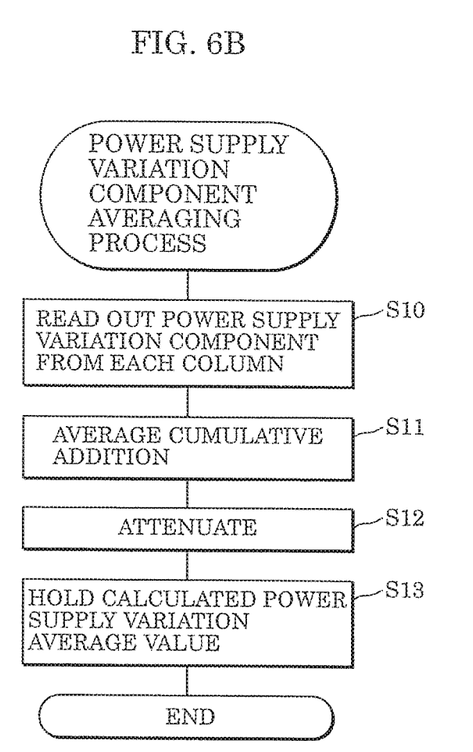
FIG. 6B is an operation flowchart illustrating power supply variation component averaging process for a solid-state imaging device according to an embodiment.
Figure 6C:
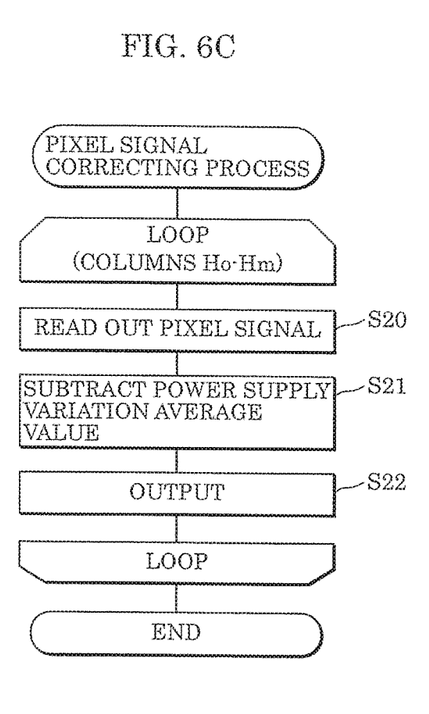
FIG. 6C is an operation flowchart illustrating a pixel signal correcting process for a solid-state imaging device according to an embodiment.

FIG. 6A is an operation flowchart illustrating the correction method for solid-state imaging device 1 according to the embodiment. FIG. 6B is an operation flowchart illustrating a power supply variation component averaging process for solid-state imaging device 1 according to the embodiment. FIG. 6C is an operation flowchart illustrating a pixel signal correcting process for solid-state imaging device 1 according to the embodiment.

As illustrated in FIG. 6A, the correction method for solid-state imaging device 1 according to the embedment includes: performing a process of averaging power supply variation components ΔVdd (S1); and performing a pixel signal correcting process (S2).

First, the averaging process (S1) will be described with reference to FIG. 6B.

Before the averaging process, controller 20 outputs control signal CN10 and resets averaging circuit 72, attenuating circuit 75, and subtracting circuit 71. Subsequently, controller 20 performs the process of averaging power supply variation components ΔVdd for each row (S1).

First, controller 20 sequentially reads out, for one row of pixel array unit 10, the power supply variation components of the respective columns detected by power supply variation detector 26b, from respective power supply variation sensors 65 to power supply variation corrector 70 through horizontal signal line 18 (S10).

Next, controller 20 causes cumulative adder 73 to cumulatively accumulate the power supply variation components of the respective columns and causes divider 74 to divide the cumulatively added power supply variation components by the number of columns of power supply variation sensors 65, thus calculating the cumulative addition average value of the power supply variation components (S11). In this way, the power supply variation average signal in said row is calculated.

Next, controller 20 causes attenuating circuit 75 to calculate a power supply variation average signal which is the product of the power supply variation average signal calculated by averaging circuit 72 and pixel gain Gain1 defined by the charge accumulator and the amplification transistor in pixel 3 (S12).

Next, controller 20 causes power supply variation corrector 70 to hold the power supply variation average signal calculated by attenuating circuit 75 until the pixel signals from first column H0 to last column Hm in said row are transmitted to power supply variation corrector 70 (S13). Steps S10 to S13 described above correspond to the averaging process (S1).

Next, the pixel signal correcting process (S2) will be described with reference to FIG. 6C.

First, controller 20 reads out the pixel signal in one row that corresponds to column H0 to subtracting circuit 71 in power supply variation corrector 70 through horizontal signal line 18 (S20).

Next, controller 20 causes subtracting circuit 71 to subtract the corresponding power supply variation average signal from the pixel signal in one row that corresponds to column H0 (S21).

Next, controller 20 causes output signal line 17 to output the corrected pixel signal on which the subtracting process has been performed in subtracting circuit 71 (S22).

The operations in the above Steps S20 to S22 are also performed on columns H1 to Hm in the same manner; thus, all the image signals in one row are corrected, and video data D1 is obtained. Subsequently, the pixel signals in the other rows are corrected in the same manner.

Note that when the number of columns in power supply variation detector 26b is 2 to the n-th power (2, 4, 8, 16, . . . ), a bit shift may be substituted for averaging circuit 72.

As described above, in the correction method for solid-state imaging device 1 according to the present embodiment, first, power supply variation components ΔVdd in one row that correspond to all the pixel columns are transmitted to horizontal signal line 18, and then the pixel signals in said row that correspond to the respective columns are sequentially transmitted from respective column AD circuits 25 to horizontal signal line 18 and are corrected. This means that controller 20 causes power supply variation corrector 70 to output the detection signal of the power supply variation components detected by power supply variation detector 26b before the pixel signal detected by column processor 26*a*. The abovementioned operation in the horizontal scanning period is performed on each row, and video data in one frame is output to the video data terminal; thus, the sequence ends.

With the above-described correction method for solid-state imaging device 1 according to the present embodiment, it is possible to accurately reduce image quality deterioration that is due to external noise superimposed on the power supply voltage supplied to pixel 3.

Note that the correction method for solid-state imaging device 1 according to the present embodiment is not limited to the above-described correction method.

Figure 7:
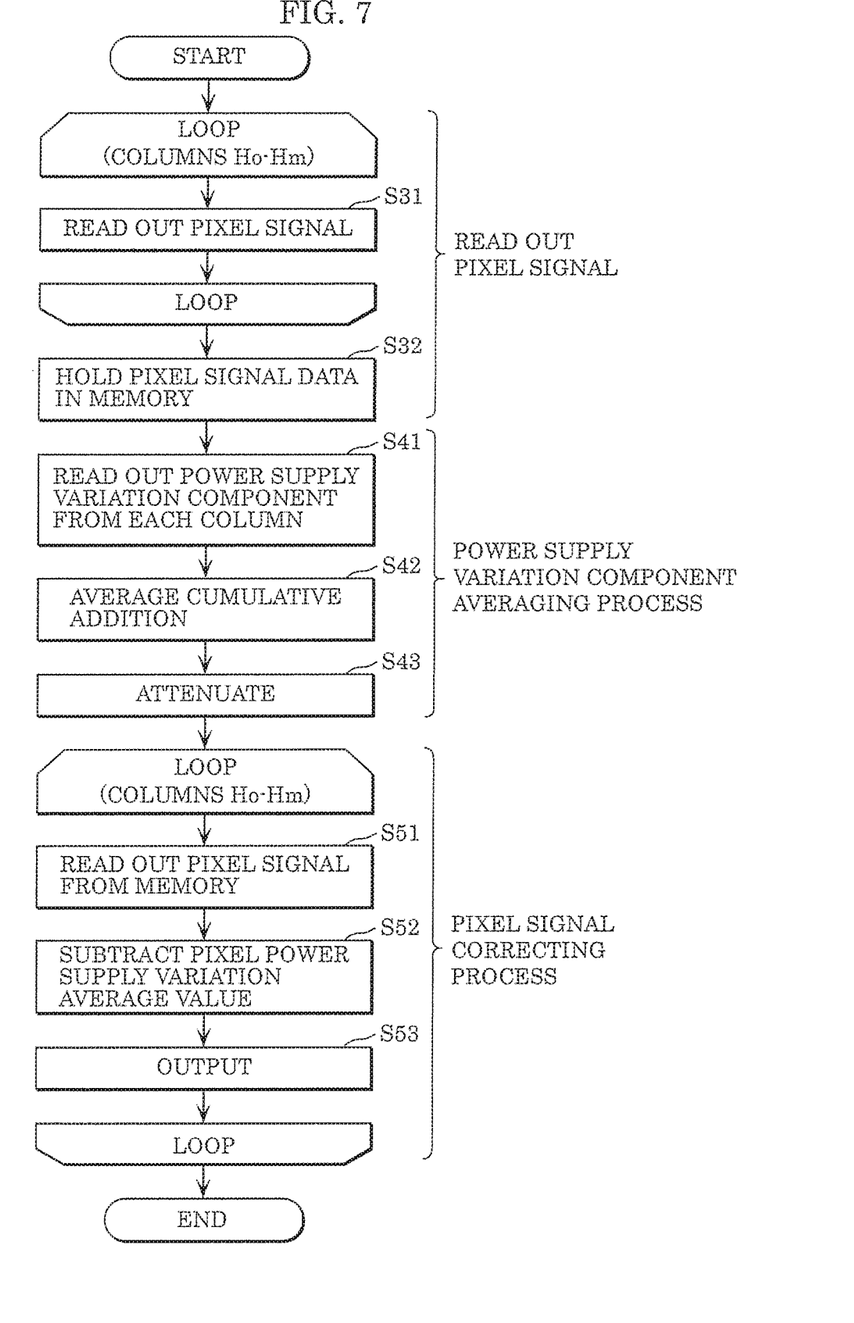
FIG. 7 is an operation flowchart illustrating a correction method for a solid-state imaging device according to Variation 1 of an embodiment.

FIG. 7 is an operation flowchart illustrating a correction method for the solid-state imaging device according to Variation 1 of the embodiment. The correction method according to the present variation is different from the correction method according to the embodiment in the processing order of the readout of the pixel signal from column processor 26*a* to power supply variation corrector 70 and the readout of power supply variation component ΔVdd from power supply variation detector 26*b* to power supply variation corrector 70.

First, controller 20 reads out the pixel signal in one row that corresponds to column H0 to power supply variation corrector 70 through horizontal signal line 18 (S31).

The operation in the above Step S31 is also performed on columns H1 to Hm in the same manner.

Next, controller 20 causes the pixel signals in one row read in the above Step S31 to be held until the power supply variation average signal in said row is calculated by power supply variation corrector 70 (S32).

Next, controller 20 sequentially reads out, for one row of pixel array unit 10, the power supply variation components of the respective columns detected by power supply variation detector 26*b*, from respective power supply variation sensors 65 to power supply variation corrector 70 through horizontal signal line 18 (S41).

Next, controller 20 causes cumulative adder 73 to cumulatively accumulate the power supply variation components of the respective columns and causes divider 74 to divide the cumulatively added power supply variation components by the number of columns of power supply variation sensors 65, thus calculating the cumulative addition average value of the power supply variation components (S42). In this way, the power supply variation average signal in said row is calculated.

Next, controller 20 causes attenuating circuit 75 to calculate a power supply variation average signal which is the product of the power supply variation average signal calculated by averaging circuit 72 and pixel gain Gain1 defined by floating diffusion layer FD and amplification transistor T12 in pixel 3 (S43).

Next, controller 20 causes the previously held pixel signal in one row that corresponds to column H0 to be read out to subtracting circuit 71 in power supply variation corrector 70 (S51).

Next, controller 20 causes subtracting circuit 71 to subtract the corresponding power supply variation average signal from the pixel signal in one row that corresponds to column H0 (S52).

Next, controller 20 causes output signal line 17 to output the corrected pixel signal in one row that corresponds to column H0 on which the subtracting process has been performed in subtracting circuit 71 (S53).

The operations in the above Steps S51 to S53 are also performed on columns H1 to Hm in the same manner.

With the above-described correction method for solid-state imaging device 1 according to the present variation, it is possible to accurately reduce image quality deterioration that is due to external noise superimposed on the power supply voltage supplied to pixel 3.

8. Circuit Configuration of Pixel 3 According to Variation

Figure 8:
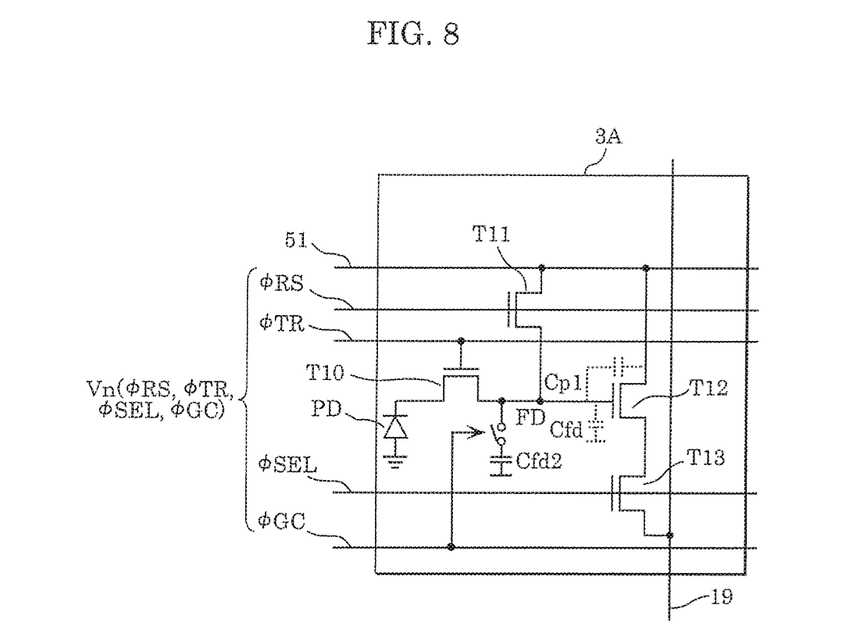
FIG. 8 illustrates one example of the circuit configuration of a pixel according to Variation 2 of an embodiment.

FIG. 8 illustrates one example of the circuit configuration of pixel 3A according to Variation 2 of the embodiment. Pixel 3A is different from pixel 3 according to the embodiment in that pixel 3A is configured to have a function capable of switching the capacitance value of floating diffusion layer FD. Hereinafter, regarding pixel 3A according to the present variation, description will not be repeated for points which are the same pixel 3 in the embodiment and will be centered on the points of difference from the embodiment.

In pixel 3A, in addition to the structural elements of pixel 3, additional capacitor Cfd2 is connected to floating diffusion layer FD via a switch. With this, pixel 3A according to the present variation can switch the pixel gain. Vertical scanning circuit 14 allows the switch to be switched between conduction and non-conduction through gain control line φGC.

When the switch is in the non-conducting state, the pixel gain of pixel 3A is Gain1 defined by Expression 1. In contrast, when the switch is the conducting state, the pixel gain of pixel 3A is represented by Expression 4 below.

[Math. 4]

$$\text{Gain2} = \frac{Cp1}{Cfd + Cfd2 + Cp1} \cdot GSF \quad \text{(Expression 4)}$$

Power supply variation corrector 70 for this pixel 3A may be configured such that attenuating circuit 75 has two different attenuation values, namely, Gain1 and Gain2.

First, when gain control line φGC is at the low level, the switch is in the non-conducting state, and the higher one of the pixel gains, that is, Gain1, is selected. In contrast, when gain control line φGC is at the high level, the switch is in the conducting state, and the lower one of the pixel gains, that is, Gain2, is selected.

In response to this switching operation, controller 20 may link switching of the switch and switching of the attenuation value of attenuating circuit 75 in power supply variation corrector 70.

Specifically, Gain1 is selected as the attenuation value of attenuating circuit 75 to place the switch in the non-conducting state, and Gain2 is selected as the attenuation value of attenuating circuit 75 to place the switch in the conducting state.

With the abovementioned configuration, even when the pixel gain is charged through gain control line φGC, it is possible to accurately correct the power supply variation value by appropriately selecting the attenuation value of attenuating circuit 75.

9. Camera

Solid-state imaging devices 1 according to the above-described embodiment and the variations thereof are used in cameras (imaging devices).

Figure 9:
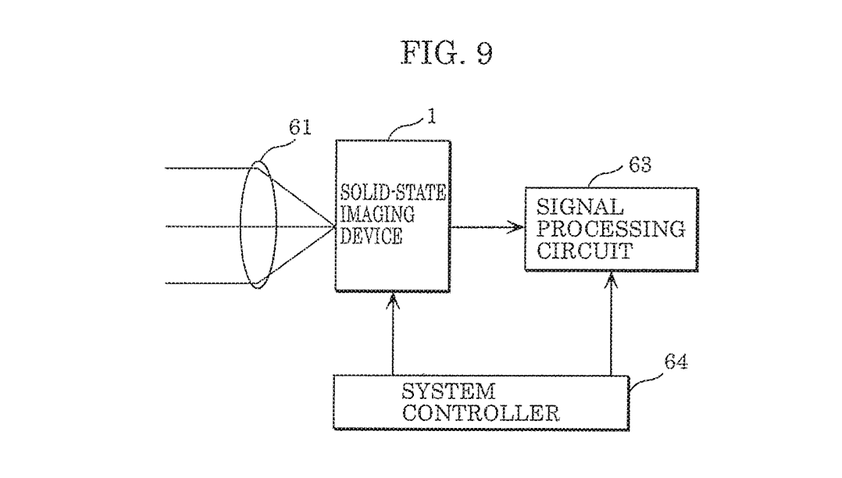
FIG. 9 is a block diagram illustrating one example of a configuration of an imaging device (camera system) including a solid-state imaging device according to an embodiment.

FIG. 9 is a block diagram illustrating one example of the configuration of a camera (imaging device) including solid-state imaging device 1 according to the present embodiment. The camera (imaging device) in this figure include solid-state imaging device 1, lens 61, signal processing circuit 63, and system controller 64.

With this configuration, it is possible to provide a camera (imaging device) in which image quality deterioration due to external noise superimposed on the power supply voltage supplied to a pixel is accurately reduced.

Other Embodiments

The solid-state imaging device and the imaging device according to the present disclosure are not limited to the above embodiments. The present disclosure includes other embodiments implemented through a combination of arbitrary structural elements of the above embodiments and variations thereof, or variations obtained through the application of various modifications to the above embodiments and variations thereof that may be conceived by a person having ordinary skill in the art, without departing from the essence of the present disclosure, and various devices in which the solid-state imaging device according to the present disclosure are built-in.

Furthermore, in solid-state imaging device 1, pixel 3 is formed on the surface of the semiconductor substrate, that is, on the same surface side as the surface on which the gate terminal of the transistor and the wire are formed, but it is also possible to use the structure of what is called a backside irradiation type image sensor (backside irradiation type solid-state imaging device) in which pixel 3 is formed on the back surface of the semiconductor substrate, that is, on the surface side opposite the surface on which the gate terminal of the transistor and the wire are formed.

Furthermore, in solid-state imaging device 1, photodiode (depletion-type p-n junction photodiode) PD is used as a light-receiving element in pixel 3, but this is not limiting; another light-receiving element (for example, a depletion region in which the electric field under a photogate is induced) may be used.

Furthermore, in order to cancel noise variations in second column signal lines 69 or random noise in each horizontal line, power supply variation detector 26b may include a large number of power supply variation sensors 65, but it is sufficient that at least one power supply variation sensor 65 be provided. With this, it is possible to accurately reduce image quality deterioration that is due to external noise superimposed on the power supply voltage supplied to pixel 3.

Furthermore, in the configuration of pixels 3 included in the imaging region it is also possible to use a configuration in which a pixel is selected according to the floating diffusion potential without using the selection transistor. Moreover, it is also possible to use a unit cell in which a plurality of pixels share a reset transistor and a source-follower transistor.

Furthermore, controller 20, column processor 26a, power supply variation detector 26b, power supply variation corrector 70, and the like according to the above embodiment may be typically implemented as large-scale integration (LSI) which is an integrated circuit. The processors such as controller 20, column processor 26a, power supply variation detector 26b, and power supply variation corrector 70 may be integrated into individual chips, or a portion or all of the processors may be integrated into one chip.

Moreover, the method of circuit integration is not limited to the LSI; the circuit integration may be implemented as a dedicated circuit or a general purpose processor. A field programmable gate array (FPGA) that can be programmed after manufacturing the LSI or a reconfigurable processor that allows reconfiguration of the connection or configuration of the inner circuit cells of the LSI can be used for the same purpose.

Although only seine exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can suppress image quality deterioration that is due to external noise attributed to a power supply voltage supplied to a pixel, and is applicable, for example, to various camera systems such as CMOS solid-state imaging devices, digital still cameras, movie cameras, cellular phones with cameras, surveillance cameras, in-vehicle cameras, and cameras for medical use.

What is claimed is:

1. A solid-state imaging device comprising:
   pixels each of which generates a pixel signal;
   a first detector which detects the pixel signal;
   a power supply wire which applies a power supply voltage to the pixels;
   a second detector which detects power supply variation components in correspondence with pixel rows in each of which more than one of the pixels are arranged in a row;
   a column signal line which supplies the power supply variation components to the second detector; and
   a corrector which corrects, for each of the pixel rows, the pixel signal detected by the first detector, using the power supply variation components,
   wherein the column signal line is directly connected to the power supply wire, and
   wherein the corrector includes:
      an averaging circuit which calculates a power supply variation average signal by averaging the power supply variation components;
      an attenuating circuit which attenuates the power supply variation average signal supplied from the averaging circuit using a predetermined attenuation value corresponding to the pixel signal; and
      a subtracting circuit which corrects the pixel signal by subtracting, from the pixel signal, the power supply variation average signal supplied from the attenuating circuit and attenuated using the predetermined attenuation value.

2. The solid-state imaging device according to claim 1, wherein the power supply variation components are attributed to variations in the power supply voltage.

3. The solid-state imaging device according to claim 1, wherein the second detector includes a power supply variation sensor which detects the power supply variation components in correspondence with the pixel rows.

4. The solid-state imaging device according to claim 1, further comprising:
a controller which causes a detection signal of the power supply variation components to be output to the corrector before the pixel signal detected by the first detector.

5. The solid-state imaging device according to claim 4, wherein the first detector detects the pixel signal through correlated double sampling, and
the second detector detects the power supply variation components through the correlated double sampling at a same timing as a timing of detecting the pixel signal by the first detector.

6. The solid-state imaging device according to claim 1, wherein the corrector holds the power supply variation average signal for a corresponding one of the pixel rows until the pixel signal in each of the pixel rows is output from the first detector, and
the subtracting circuit corrects the pixel signal by subtracting, from the pixel signal detected in each of the pixel rows, the power supply variation average signal attenuated using the predetermined attenuation value.

7. The solid-state imaging device according to claim 1, wherein each pixel includes:
a light receiver which performs photoelectric conversion corresponding to incident light;
a charge accumulator in which charges generated through the photoelectric conversion by the light receiver are accumulated and retained; and
an amplifier which amplifies a voltage corresponding to the charges retained in the charge accumulator and outputs the voltage that has been amplified as the pixel signal,
wherein the predetermined attenuation value corresponds to a pixel gain defined by the charge accumulator and the amplifier.

8. The solid-state imaging device according to claim 7, wherein each pixel further includes
a switching element which switches between connection and disconnection between an additional capacitor and the charge accumulator, and
the solid-state imaging device links switching of the switching element and switching of the predetermined attenuation value.

9. The solid-state imaging device according to claim 3, further comprising:
a first analog-to-digital (AD) conversion circuit which converts the pixel signal transmitted in a column into a digital signal, and detects the pixel signal through correlated double sampling,
wherein the power supply variation sensor is a second AD conversion circuit which converts the power supply variation components into a digital signal, and detects the power supply variation components through the correlated double sampling.

10. The solid-state imaging device according to claim 9, further comprising:
a reference signal generator which generates a ramp signal for digital conversion in the first AD conversion circuit and the second AD conversion circuit,
wherein when the power supply variation components detected by the second detector are a negative signal, the reference signal generator outputs the ramp signal that has been offset.

11. The solid-state imaging device according to claim 1, wherein the pixels, the first detector, and the second detector are included in a same large-scale integration (LSI) chip, and
the corrector is externally connected to the LSI chip.

12. An imaging device comprising:
the solid-state imaging device according to claim 1.

* * * * *